(12) United States Patent
Baba et al.

(10) Patent No.: US 9,974,167 B1
(45) Date of Patent: May 15, 2018

(54) WIRING BOARD

(71) Applicant: FUJITSU LIMITED, Kawasaki-shi, Kanagawa (JP)

(72) Inventors: Shunji Baba, Yokohama (JP); Noritsugu Ozaki, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days. days.

(21) Appl. No.: 15/801,375

(22) Filed: Nov. 2, 2017

(30) Foreign Application Priority Data

Dec. 14, 2016 (JP) ................. 2016-242487

(51) Int. Cl.
H05K 1/00 (2006.01)
H05K 1/09 (2006.01)
H05K 1/02 (2006.01)
H05K 1/03 (2006.01)

(52) U.S. Cl.
CPC ......... H05K 1/0296 (2013.01); H05K 1/0393 (2013.01); H05K 2201/05 (2013.01)

(58) Field of Classification Search
CPC . H05K 1/0296; H05K 2201/05; H05K 1/0393
USPC ................. 174/251, 254; 361/749
See application file for complete search history.

(56) References Cited

U.S. PATENT DOCUMENTS

| 2012/0051005 A1* | 3/2012 | Vanfleteren | H01L 21/565 361/749 |
| 2014/0022746 A1* | 1/2014 | Hsu | H05K 1/0271 361/750 |
| 2015/0065840 A1* | 3/2015 | Bailey | A61B 5/6802 600/384 |

FOREIGN PATENT DOCUMENTS

JP 2002-75083 3/2002
JP 2014-236103 12/2014

* cited by examiner

Primary Examiner — Sherman Ng
(74) Attorney, Agent, or Firm — Fujitsu Patent Center

(57) ABSTRACT

A wiring board includes: a base member having stretchability; and a wiring including a plurality of conductive thread-like members that are sewn in the base member in a meandering manner and do not have stretchability.

12 Claims, 13 Drawing Sheets

WIRING BOARD

CROSS-REFERENCE TO RELATED APPLICATION

This application is based upon and claims the benefit of priority of the prior Japanese Patent Application No. 2016-242487, filed on Dec. 14, 2016, the entire contents of which are incorporated herein by reference.

FIELD

The embodiment discussed herein is related to a wiring board.

BACKGROUND

In a stretchable wiring board, a wiring is formed on a surface of a base member having stretchability.

Japanese Laid-open Patent Publication No. 2014-236103 or Japanese Laid-open Patent Publication No. 2002-75083 disclose related art.

SUMMARY

According to an aspect of the embodiments, a wiring board includes: a base member having stretchability; and a wiring including a plurality of conductive thread-like members that are sewn in the base member in a meandering manner and do not have stretchability.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

For example, a stretchable circuit board includes a stretchable base member and a conductive pattern which is formed on the stretchable base member and contains an elastomer, such as silicone rubber and urethane rubber, and conductive fine particles.

For example, in a stretchable cord serving as a wiring having stretchability, a pipe-like coating material containing an elastic material such as silicon is provided on a round rod-like core material around which a conductive metal wire is wound in a coil shape and which contains an elastic material such as silicon, or a round rod-like core material is directly coated by an elastic material such as silicon.

For a wiring provided on a stretchable wiring board, a conductive paste, for example, in which conductive particles of Ag filler, for example, are dispersed in a rubber-based binder made of silicone rubber, for example, is used so as to enable the wiring to expand and contract along with expansion and contraction of a base member. For example, a conductive paste based on a rubber-based material has lower conductivity and larger electric resistance than a conductive paste based on a material having no stretchability such as polyester resin. Table provided below illustrates examples of conductivity of a conductive paste 1 based on a rubber-based material having stretchability and a conductive paste 2 based on polyester resin having no stretchability. The conductivity of the conductive paste 1 based on a rubber-based material is approximately one-fifth of the conductivity of the conductive paste 2 based on polyester resin.

TABLE

|  | Conductive paste 1 | Conductive paste 2 |
|---|---|---|
| Product name | ThreeBond 3303N | FA-333 |
| Maker | ThreeBond Co., Ltd. | Fujikura Kasei Co., Ltd. |
| Composition | Silicone rubber/Ag filler | Polyester resin/Ag filler |
| Conductivity ($\Omega \cdot$ cm) | $2.3 \times 10^{-4}$ | $4.0 \times 10^{-5}$ |

Figure 1A:
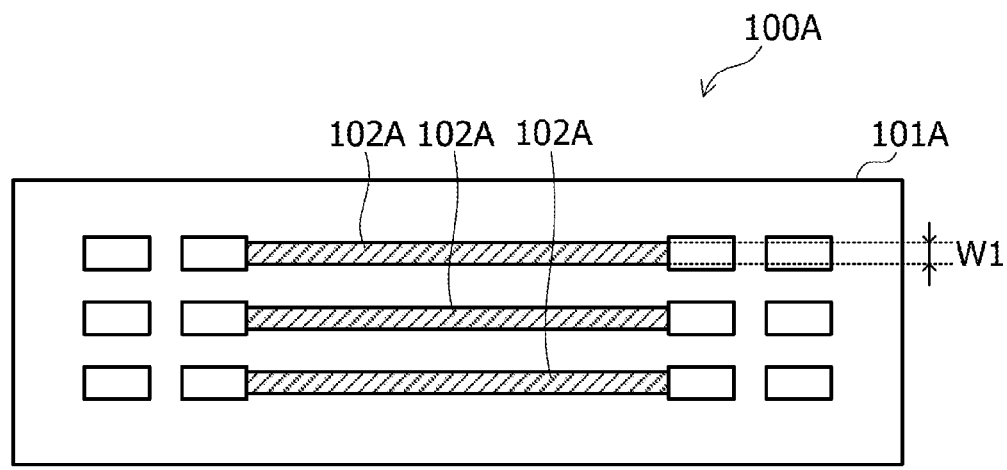
FIGS. 1A and 1B illustrate an example of a plan view of a wiring pattern.
Figure 1B:
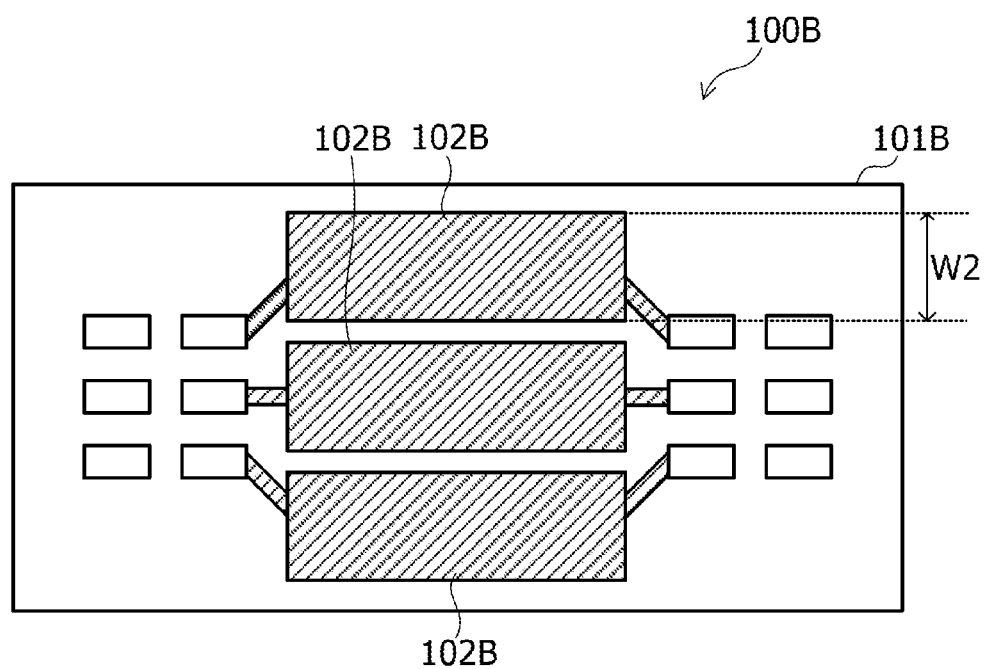

FIG. 1A and FIG. 1B illustrate an example of a plan view of a wiring pattern. FIG. 1A illustrates a wiring pattern on a wiring board 100A in which a conductive paste based on polyester resin is used as a material of the wiring. FIG. 1B illustrates a wiring pattern on a wiring board 100B in which a conductive paste based on a rubber-based material is used as a material of the wiring. The wiring board 100A includes a base member 101A and a plurality of wirings 102A arranged side by side on a surface of the base member 101A. In a similar manner, the wiring board 100B includes a base member 101B and a plurality of wirings 102B arranged side by side on a surface of the base member 101B.

A width W2 of the wiring 102B is set to be five times a width W1 of the wiring 102A so as to set a resistance value of the wiring 102B substantively same as a resistance value of the wiring 102A. For example, in the case where the width W1 of the wiring 102A is 0.5 mm and a wiring pitch is 1 mm on the wiring board 100A, the width W2 of the wiring 102B is set to 2.5 mm and a wiring pitch is set to 3 mm on the wiring board 100B.

Thus, in the case where wirings are formed by using a conductive paste based on a material having stretchability, a wiring width is larger than that in the case where wirings are formed by using a conductive paste based on a material having no stretchability, increasing an occupancy area of wirings. As a result, flexibility of arrangement of wirings may be lowered or an area of a wiring board may be increased.

For example, a wiring board may be provided in which an occupancy area of wirings is suppressed and which includes stretchable wirings having a resistance value equivalent to that in the case where a conductive paste based on a material having no stretchability such as polyester resin is used.

In the following drawings, components which are same as each other or equivalent to each other are given identical reference characters.

Figure 2:
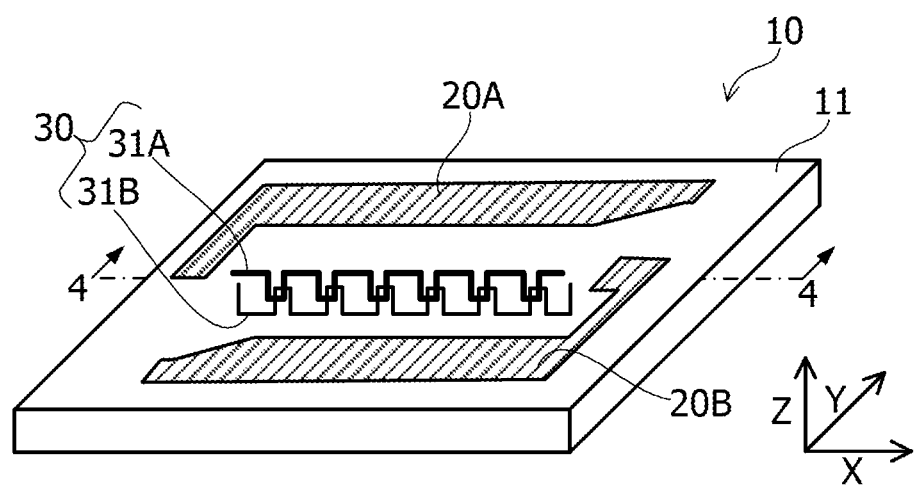
FIG. 2 illustrates an example of a perspective view of a wiring board.

FIG. 2 illustrates an example of a perspective view of a wiring board. A wiring board 10 includes a base member 11 and wirings 20A, 20B, and 30 provided on the base member 11. "The base member 11 has stretchability" represents that the base member 11 stretches and deforms when a tensile force is applied to the base member 11 and returns to be in an original shape when an external force is removed.

The base member 11 may include a film-like insulating material having stretchability such as urethane rubber and silicone rubber, for example.

Figure 3A:
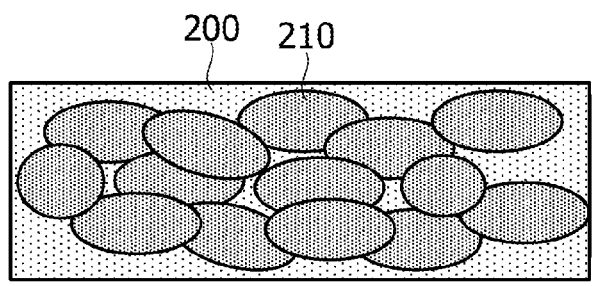
FIG. 3A illustrates an example of a constituent material of wirings including a power source wiring and a ground wiring.

The wiring 20A may be a power source wiring to which a power source voltage is supplied, for example. The wiring 20B may be a ground wiring to which a ground voltage is supplied, for example. FIG. 3A illustrates an example of a constituent material of a wiring. FIG. 3A illustrates a constituent material of the wirings 20A and 20B. The wirings 20A and 20B are formed by using a conductive paste in which conductive particles 210 of Ag filler, for example, are dispersed in a binder 200 made of a rubber-based material such as silicone rubber having stretchability. The binder 200 is thus made of a rubber-based material, enabling the wirings 20A and 20B to expand and contract along with expansion and contraction of the base member 11. "The wirings 20A and 20B have stretchability" represents that the wirings 20A and 20B stretch and deform when a tensile force is applied to the wirings 20A and 20B and the wirings 20A and 20B return to be in original shapes when an external force is removed.

Figure 3B:
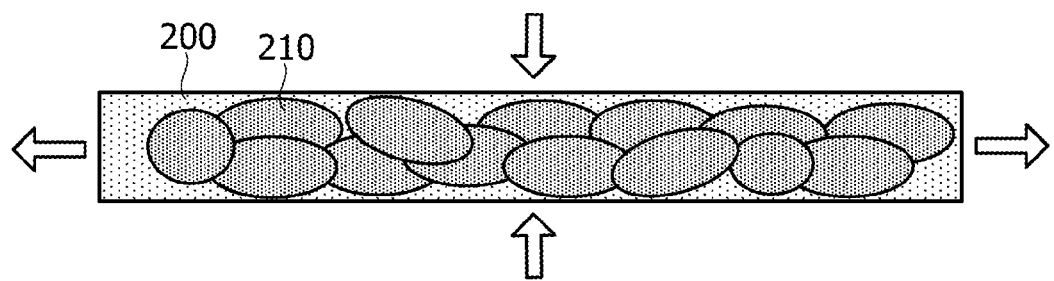
FIG. 3B illustrates an example of a state that the wirings, which are the power source wiring and the ground wiring, are stretched.

FIG. 3B illustrates an example of a state that a wiring is stretched. FIG. 3B illustrates a state that the wirings 20A and 20B are stretched in a lateral direction of FIG. 3B. When the binder 200 made of a rubber-based material is stretched in the lateral direction of FIG. 3B, a compressive force acts in a vertical direction of FIG. 3B and accordingly, contact among the conductive particles 210 are maintained. Thus, even in the case where the wirings 20A and 20B expand and contract along with expansion and contraction of the base member 11, a conductive property of the wirings 20A and 20B is maintained. Though the wirings 20A and 20B are formed by using a conductive paste based on a rubber-based material having low conductivity, resistance values of the wirings 20A and 20B may be suppressed because the wirings 20A and 20B are formed on the surface of the base member 11 in a manner to have relatively larger areas as illustrated in FIG. 2.

The wiring 30 may be a signal wiring through which a signal is transmitted. The wiring 30 includes conductive thread-like members 31A and 31B which do not have stretchability in themselves. As the conductive thread-like members 31A and 31B, a metal wire made of metal such as copper and aluminum may be used, for example. As the conductive thread-like members 31A and 31B, a conductive yarn which is formed by coating a surface of a yarn, which is made of a material having no conductive property, such as a polyester yarn by metal such as copper may be used. For example, an elongation direction of the wiring 30 may be defined as the X direction, a direction which is a thickness direction of the base member 11 and is orthogonal to the X direction may be defined as the Z direction, and a direction which is orthogonal to both of the X direction and the Z direction may be defined as the Y direction. "The conductive thread-like members 31A and 31B have no stretchability" represents that the conductive thread-like members 31A and 31B do not substantively deform in a direction in which a tensile force acts when the tensile force is applied to the conductive thread-like members 31A and 31B.

Figure 4A:
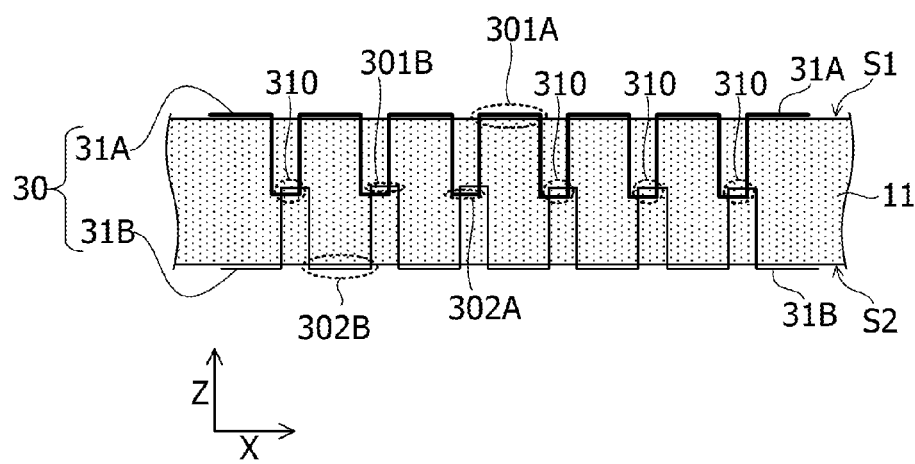
FIG. 4A illustrates an example of a sectional view taken along a line IV-IV of FIG. 2.

FIG. 4A is a sectional view of the wiring board 10 taken along a line IV-IV of FIG. 2. The conductive thread-like member 31A meanders within a surface which is orthogonal to a first surface S1, which is a main surface of the base member 11, and a second surface S2, which is an opposite surface to the first surface S1, (within the X-Z surface) so as to form a plurality of fold-back parts 301A and 302A. In a similar manner, the conductive thread-like member 31B meanders within the surface which is orthogonal to the first surface S1 and the second surface S2 of the base member 11 (within the X-Z surface) so as to form a plurality of fold-back parts 301B and 302B. The fold-back parts 301B of the conductive thread-like member 31B are entangled with respective fold-back parts 302A, which are on one side, of the conductive thread-like member 31A. For example, an interlaced part 310, on which the conductive thread-like members 31A and 31B are entangled with each other, is formed on each set of the fold-back parts 302A and 301B. For example, at least surfaces of the conductive thread-like members 31A and 31B have a conductive property and the conductive thread-like members 31A and 31B are electrically connected with each other on each of the interlaced parts 310. For example, a single wiring 30 for transmitting a single signal is composed of two conductive thread-like members 31A and 31B.

Figure 4B:
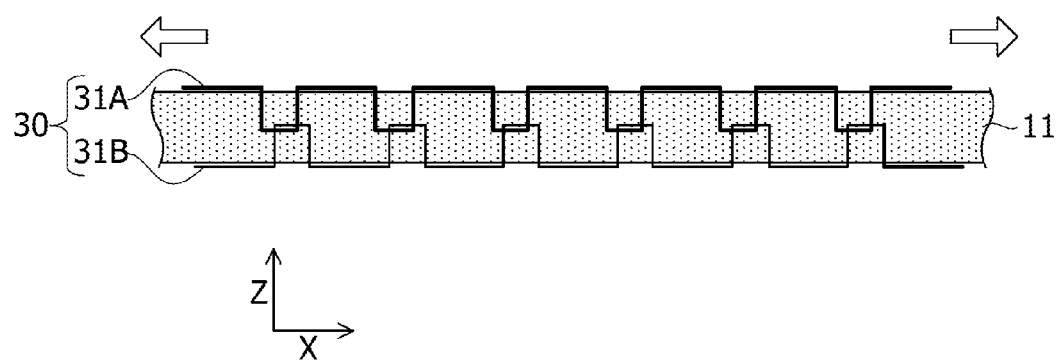
FIG. 4B illustrates an example of a state that a base member of the wiring board is stretched.

FIG. 4B illustrates a state that the base member 11 is stretched in the X direction. When the base member 11 is stretched in the X direction and is deformed, the conductive thread-like members 31A and 31B deform along with the deformation of the base member 11. The wiring 30 is composed of the conductive thread-like members 31A and 31B which do not have stretchability in themselves. However, the conductive thread-like members 31A and 31B are sewn into the base member 11 in a meandering manner, enabling the wiring 30 to expand and contract along with expansion and contraction of the base member 11.

Figure 5A:
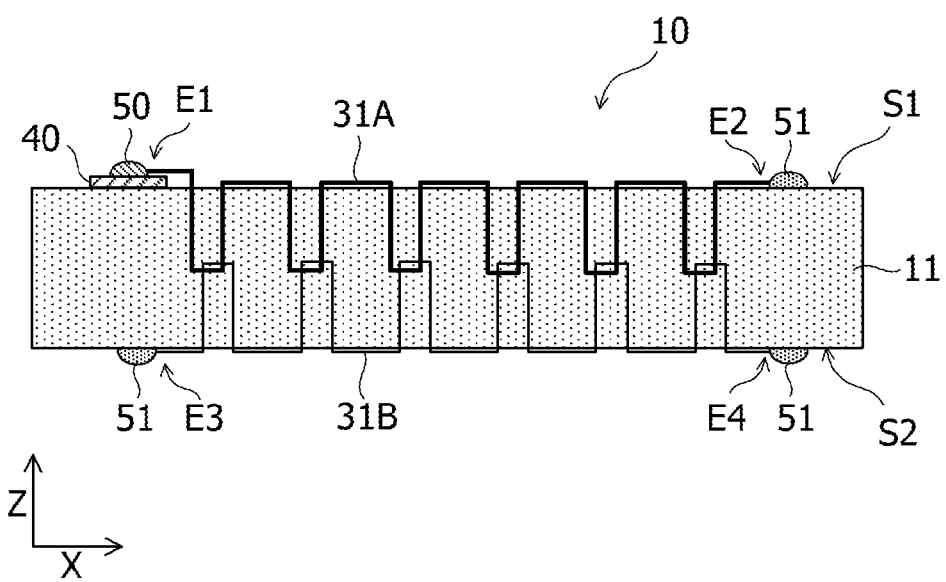
FIG. 5A and FIG. 5B illustrate an example of a sectional view of a wiring board.
Figure 5B:
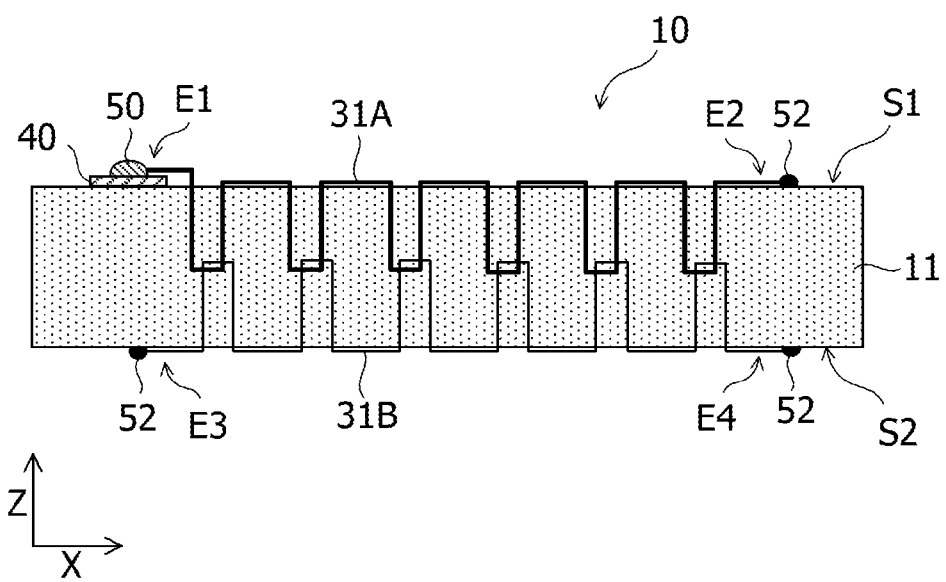

FIG. 5A and FIG. 5B illustrate an example of a sectional view of a wiring board. The conductive thread-like members 31A and 31B may be fixed on the surface of the base member 11 on terminating end parts thereof so as not to easily slip out of the base member 11. FIG. 5A illustrates a sectional view of the wiring board 10 in which the terminating end parts of the conductive thread-like members 31A and 31B are fixed on the surface of the base member 11. As illustrated in FIG. 5A, terminating end parts E1 and E2 of the conductive thread-like member 31A may be fixed on the first surface S1 of the base member 11 and terminating end parts E3 and E4 of the conductive thread-like member 31B may be fixed on the second surface S2 of the base member 11. FIG. 5A illustrates the case where the terminating end part E1 of the conductive thread-like member 31A is bonded to a wiring pattern 40 which is provided on the first surface S1 of the base member 11. In this case, the terminating end part E1 of the conductive thread-like member 31A is bonded to the wiring pattern 40 with a conductive bonding member 50. As the conductive bonding member 50, a conductive adhesive such as an Ag paste or solder, for example, may be used. The terminating end part E2 of the conductive thread-like member 31A and the terminating end parts E3 and E4 of the conductive thread-like member 31B, which are not bonded to a wiring pattern, may be respectively fixed on the first surface S1 and the second surface S2 of the base member 11 with an insulating bonding member 51 such as a silicone-based adhesive.

FIG. 5B illustrates another example of a sectional view of the wiring board 10 in which the terminating end parts of the conductive thread-like members 31A and 31B are fixed on the surface of the base member 11. On the terminating end part E2 of the conductive thread-like member 31A and the terminating end parts E3 and E4 of the conductive thread-like member 31B, which are not bonded to a wiring pattern, knots (nodes) 52 of the conductive thread-like members 31A and 31B may be respectively formed. Accordingly, the terminating end part E2 and the terminating end parts E3 and E4 are respectively fixed on the first surface S1 and the second surface S2 of the base member 11.

Figure 6A:
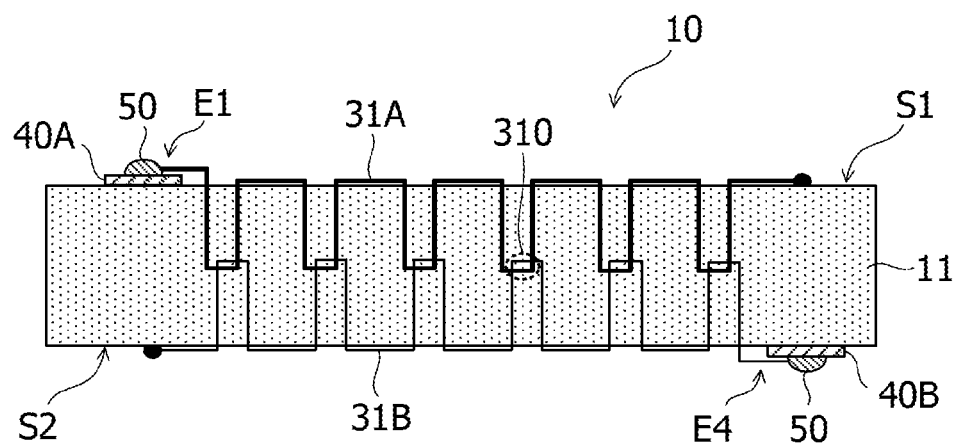
FIG. 6A and FIG. 6B illustrate an example of a sectional view of a wiring board.
Figure 6A:
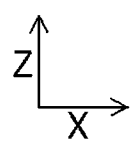
Figure 6B:
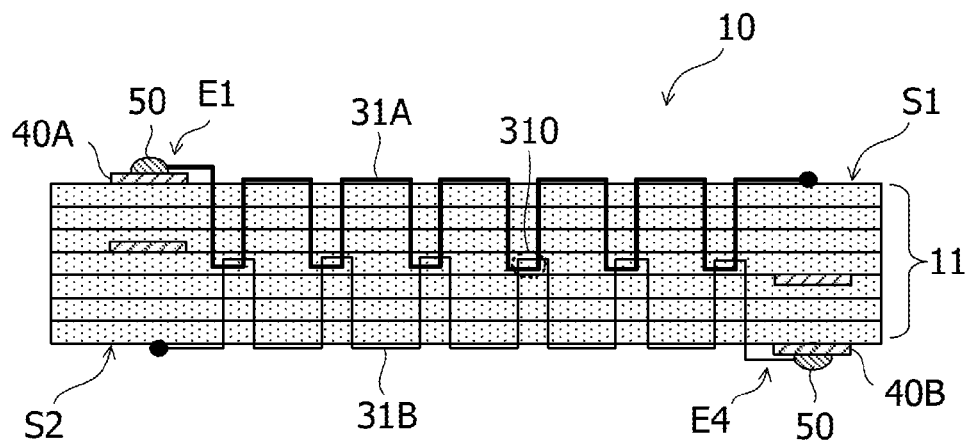
Figure 6B:
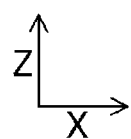

FIG. 6A and FIG. 6B illustrate an example of a sectional view of a wiring board. FIG. 6A illustrates a sectional view of the wiring board 10 corresponding to a topology between wiring patterns respectively formed on the first surface S1 and the second surface S2 of the base member 11 and the conductive thread-like members 31A and 31B. In FIG. 6A, the terminating end part E1 of the conductive thread-like member 31A is bonded to a wiring pattern 40A formed on the first surface S1 of the base member 11 with the conductive bonding member 50. The terminating end part E4 of the conductive thread-like member 31B is bonded to a wiring pattern 40B formed on the second surface S2 of the base member 11 with the conductive bonding member 50. The conductive thread-like members 31A and 31B are electrically connected with each other on the interlaced parts 310, on which the conductive thread-like members 31A and 31B are entangled with each other, and accordingly, the wiring patterns 40A and 40B are electrically connected with each other. Thus, in the case where wiring patterns are formed on both surfaces of the base member 11, the conductive thread-like members 31A and 31B may function as an interlayer wiring as well. As illustrated in FIG. 6B, the conductive thread-like members 31A and 31B may function as an interlayer wiring in a wiring board having three or more of wiring layers as well.

Figure 7A:
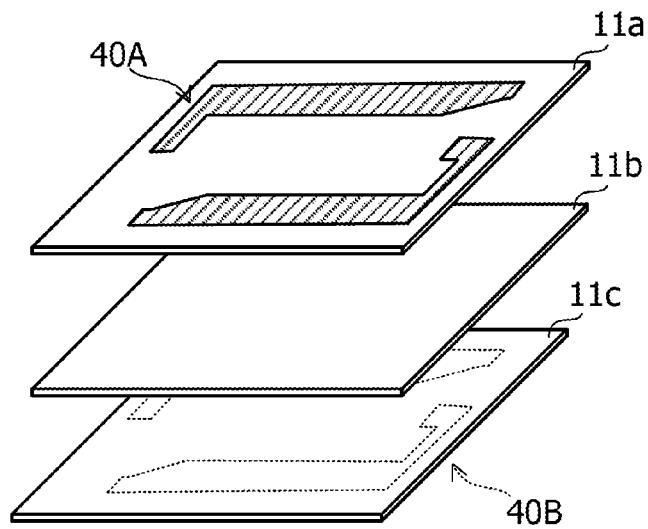
FIGS. 7A to 7C illustrate an example of a perspective view of a wiring board.
Figure 7B:
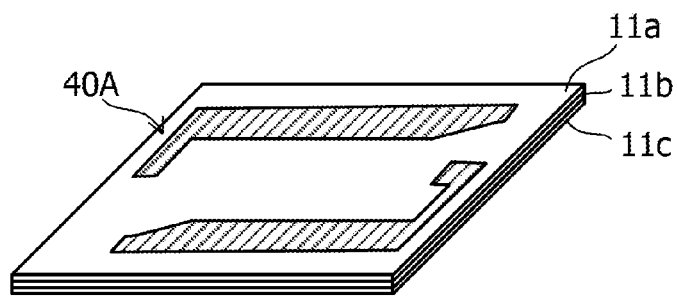
Figure 7C:
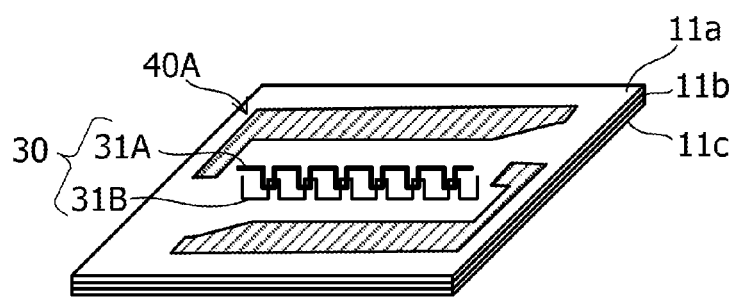
Figure 8A:
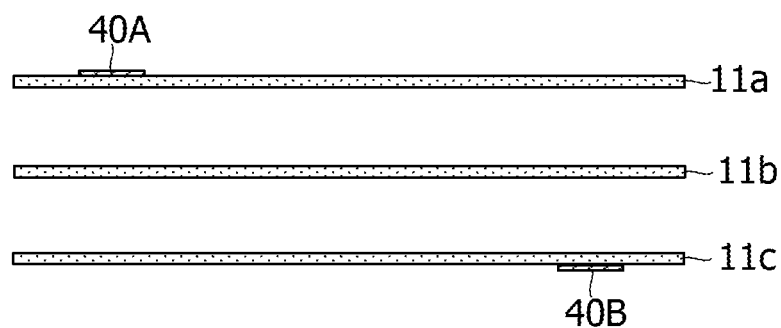
FIGS. 8A to 8C illustrate an example of a sectional view of a wiring board.
Figure 8B:
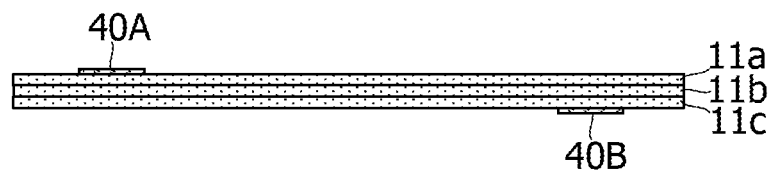
Figure 8C:
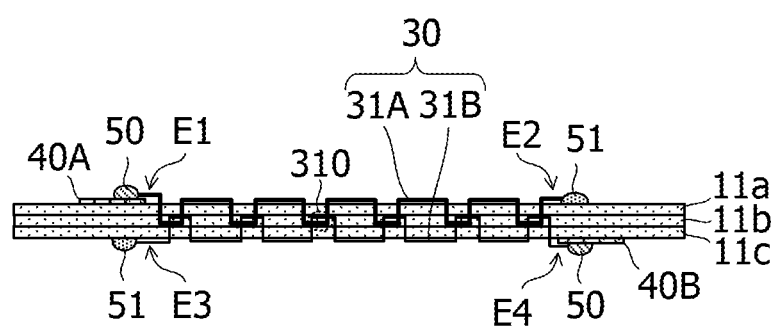

FIGS. 7A to 7C illustrate an example of a perspective view of a wiring board. FIGS. 7A to 7C illustrate a method for manufacturing the wiring board 10. FIGS. 8A to 8C illustrate an example of a sectional view of a wiring board. In FIGS. 8A to 8C, sectional views corresponding to FIGS. 7A to 7C respectively are illustrated. A method for manufacturing a wring board which includes wiring patterns on both surfaces thereof is exemplified below.

Base members 11a, 11b, and 11c containing a film-like insulating material having stretchability such as urethane rubber and silicone rubber are prepared. The wiring pattern 40A is formed on a surface of the base member 11a and the wiring pattern 40B is formed on a surface of the base member 11c. Each of the wiring patterns 40A and 40B includes the wiring 20A corresponding to a power source wiring and the wiring 20B corresponding to a ground wiring. The wiring patterns 40A and 40B are formed by printing a conductive paste, for example, in which conductive particles of Ag filler, for example, are dispersed in a binder made of a rubber-based material such as silicone rubber which has stretchability, on the surfaces of the base members 11a and 11c (FIG. 7A and FIG. 8A).

The base members 11a, 11b, and 11c are bonded to each other so that each of the wiring patterns 40A and 40B, which are respectively formed on the surfaces of the base members 11a and 11c, faces outside. The base member 11b is interposed between the base members 11a and 11b and functions as an intermediate layer. The base members 11a, 11b, and 11c are mutually bonded by thermocompression bonding, for example (FIG. 7B and FIG. 8B).

The conductive thread-like members 31A and 31B are sewn to the laminated body of the base members 11a to 11c so as to form the wiring 30. Each of the conductive thread-like members 31A and 31B is allowed to meander so as to form a plurality of fold-back parts and the conductive thread-like members 31A and 31B are sewn in the laminated body of the base members 11a to 11c so as to form the interlaced parts 310, on which the conductive thread-like members 31A and 31B are entangled with each other, on each of the fold-back parts. The conductive thread-like members 31A and 31B are electrically connected with each other on the interlaced parts 310. One terminating end part E1 of the conductive thread-like member 31A is bonded to the wiring pattern 40A with the conductive bonding member 50 such as an Ag paste and the other terminating end part E2 of the conductive thread-like member 31A is bonded to the surface of the base member 11a with the insulating bonding member 51 such as a silicone-based adhesive. One terminating end part E3 of the conductive thread-like member 31B is bonded to the surface of the base member 11c with the insulating bonding member 51 such as a silicone-based adhesive and the other terminating end part E4 of the conductive thread-like member 31B is bonded to the wiring pattern 40B with the conductive bonding member 50 such as an Ag paste. Thus, the wiring 30 is formed and the wiring pattern 40A formed on the surface of the base member 11a and the wiring pattern 40B formed on the surface of the base member 11c are electrically connected with each other (FIG. 7C and FIG. 8C).

According to the wiring board 10 described above, the wiring 30 is composed of the conductive thread-like members 31A and 31B which do not have stretchability in themselves. However, the conductive thread-like members 31A and 31B are sewn in the base member 11 in a meandering manner, for example, and accordingly, the wiring 30 expands and contracts along with expansion and contraction of the base member 11.

Since the wiring 30 is composed of the conductive thread-like members 31A and 31B which are metal wires or conductive yarns, for example, conductivity of the wiring 30 is larger than conductivity of a conductive paste containing a rubber-based material. Therefore, an occupancy area of the wiring 30 may be reduced and a resistance value of the wiring 30 may become equivalent to a resistance value of a wiring for which a conductive paste based on a material having no stretchability such as polyester resin is used.

In the case where copper wires having the length of 40 cm (conductivity $1.72 \times 10^{-6}$ $\Omega \cdot cm$) are used as the conductive thread-like members 31A and 31B, for example, 0.13 mm of the diameter of the copper wire is enough to set the resistance value of the wiring 30 as 0.5$\Omega$, for example. For example, 0.5$\Omega$ corresponds to a wiring resistance of the case where a wiring having 0.01 cm² of sectional area and 10 cm of length is formed with a conductive paste based on a material having no stretchability such as polyester resin. The length of the copper wire may be assumed to be 40 cm on the assumption that the wiring having 10 cm of length is to be stretched to 40 cm, for example.

Figure 9:
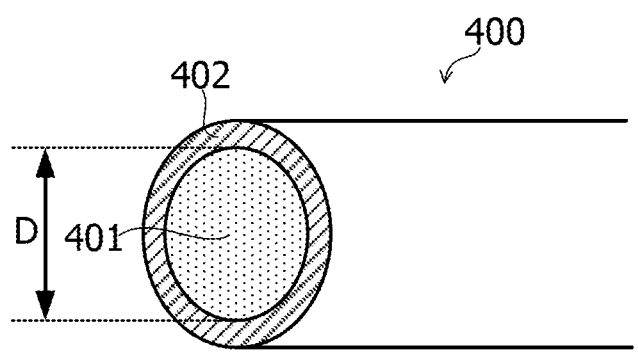
FIG. 9 illustrates an example of a model of a conductive yarn.

The diameter D of a core material of a conductive yarn, which is used as the conductive thread-like members 31A and 31B, is estimated on the assumption same as the above-described assumption. FIG. 9 illustrates an example of a model. FIG. 9 illustrates a model diagram of a conductive yarn 400 used for estimation. The conductive yarn 400 may be assumed such that a surface of a core material 401 composed of an insulator having the diameter D is coated by copper 402 having 10 µm of thickness (conductivity $1.72 \times 10^{-6}$ $\Omega \cdot$cm). In the case where the conductive yarn 400 is used as the conductive thread-like members 31A and 31B included in the wiring 30, 0.42 mm of the diameter D of the core material 401 is enough to set the resistance value of the wiring 30 as 0.5$\Omega$, for example.

Thus, the conductive thread-like members 31A and 31B having 0.5 mm or smaller of diameter may provide a resistance value which is equivalent to a resistance value of the case where a conductive paste based on a material having no stretchability such as polyester resin is used. For example, due to formation of the wiring 30 with the conductive thread-like members 31A and 31B, an occupancy area of the wiring 30 may be reduced and a resistance value of the wiring 30 may become equivalent to a resistance value of the case where a conductive paste based on a material having no stretchability such as polyester resin is used.

According to the wiring board 10 described above, since the wiring 30 is composed of two conductive thread-like members 31A and 31B, signal transmission may be maintained in the wiring 30 even if breaking of wire occurs in either one of the conductive thread-like members 31A and 31B.

According to the wiring board 10 described above, since stretchability is provided to the wiring 30 by sewing the conductive thread-like members 31A and 31B in, manufacturing cost may be reduced compared to the case where a stretchable cord is applied to the wiring board.

According to the wiring board 10 described above, the conductive thread-like members 31A and 31B are entangled with each other on a plurality of fold-back parts 302A and 301B, being fixed on the base member 11.

Accordingly, formation of the wiring 30 may be completed only by fixing the terminating end parts E1 to E4 after sewing of the conductive thread-like members 31A and 31B and thus, manufacturing may be simple.

According to the wiring board 10 described above, all of the base member 11 and the wirings 20A, 20B, and 30 are stretchable. Accordingly, the wiring board 10 on which electronic parts such as a sensor and a microchip are mounted may be mounted on a fabric product such as a garment, for example.

Figure 10:
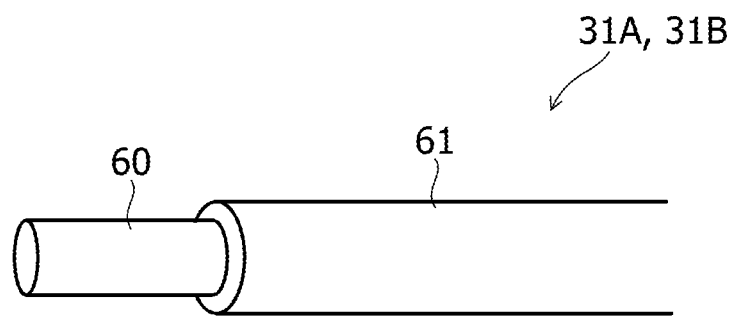
FIG. 10 illustrates an example of a perspective view of a conductive thread-like member.

FIG. 10 illustrates an example of a perspective view of a conductive thread-like member. The conductive thread-like members 31A and 31B may include a conductive wire 60 in which at least a surface of a metal wire or a conductive yarn, for example, is composed of a conductor, and a coating part 61 which is composed of an insulator coating a surface of the conductive wire 60.

The conductive thread-like members 31A and 31B are sewn in the base member so as to form a plurality of interlaced parts, on which the conductive thread-like members 31A and 31B are entangled with each other, as is the case with the wiring board 10 (see FIG. 4A). Though the conductive thread-like members 31A and 31B come into contact with each other on the interlaced parts, the conductive thread-like members 31A and 31B are electrically isolated from each other because the surfaces thereof are coated by the coating parts 61 including an insulator. Thus, the conductive thread-like members 31A and 31B are electrically isolated from each other, so that separate signals may be transmitted through the conductive thread-like members 31A and 31B. For example, two wirings which are electrically insulated from each other are formed by the conductive thread-like members 31A and 31B. For example, signals same as each other may be transmitted through the conductive thread-like members 31A and 31B which are electrically isolated from each other.

Figure 11:
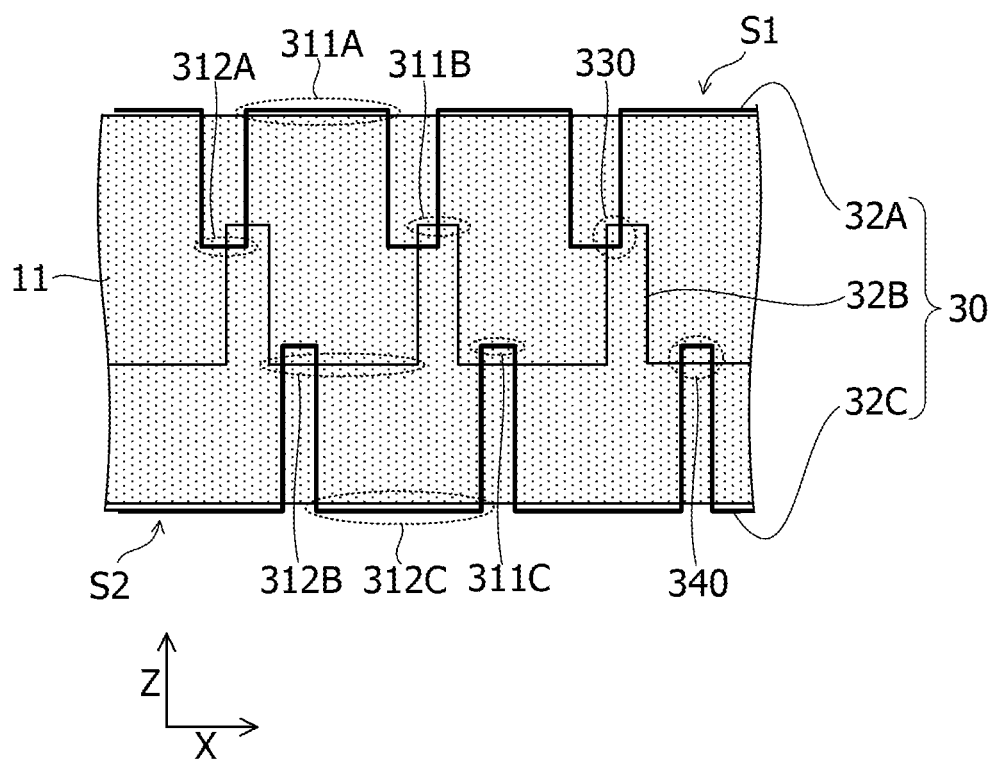
FIG. 11 illustrates an example of a sectional view of a wiring.

Though the wiring 30 is composed of two conductive thread-like members 31A and 31B in the above description, the wiring 30 may be composed of three or more conductive thread-like members. FIG. 11 illustrates an example of a sectional view of a wiring. FIG. 11 illustrates a sectional view of the wiring 30 including three conductive thread-like members 32A, 32B, and 32C.

The conductive thread-like member 32A meanders within the surface which is orthogonal to the first surface S1 and the second surface S2 of the base member 11 (within the X-Z surface) so as to form a plurality of fold-back parts 311A and 312A. In a similar manner, the conductive thread-like member 32B meanders within the surface which is orthogonal to the first surface S1 and the second surface S2 of the base member 11 (within the X-Z surface) so as to form a plurality of fold-back parts 311B and 312B. In a similar manner, the conductive thread-like member 32C meanders within the surface which is orthogonal to the first surface S1 and the second surface S2 of the base member 11 (within the X-Z surface) so as to form a plurality of fold-back parts 311C and 312C.

The fold-back parts 311B of the conductive thread-like member 32B are entangled with respective fold-back parts 312A, which are on one side, of the conductive thread-like member 32A. For example, on the fold-back parts 312A and 311B, an interlaced part 330 on which the conductive thread-like members 32A and 32B are entangled with each other is formed. The fold-back parts 311C of the conductive thread-like member 32C are entangled with respective fold-back parts 312B, which are on the other side, of the conductive thread-like member 32B. For example, on the fold-back parts 312B and 311C, an interlaced part 340 on which the conductive thread-like members 32B and 32C are entangled with each other is formed.

For example, the conductive thread-like members 32A and 32B are electrically connected with each other on each of the interlaced parts 330 and the conductive thread-like members 32B and 32C are electrically connected with each other on each of the interlaced parts 340. For example, a single wiring 30 which transmits a single signal is composed of three conductive thread-like members 32A, 32B, and 32C.

A resistance value of the wiring 30 may be further reduced by thus increasing the number of conductive thread-like members constituting the wiring 30. Redundancy of the wiring 30 may be increased and reliability may be improved.

Figure 12:
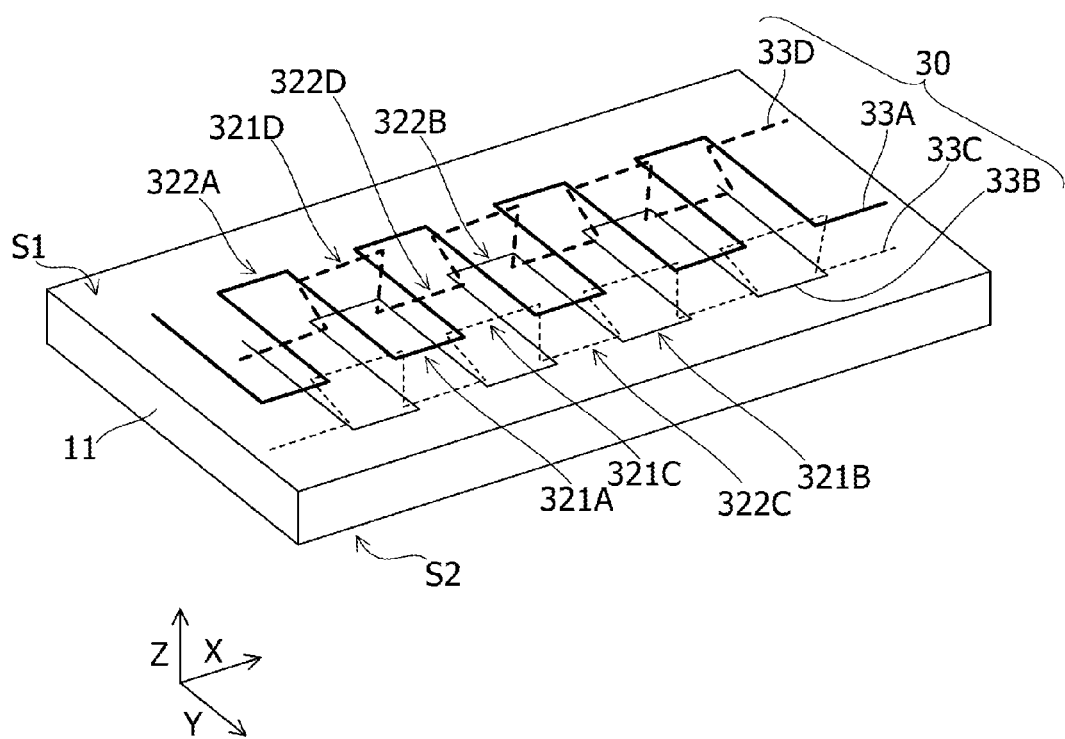
FIG. 12 illustrates an example of a perspective view of a wiring.

FIG. 12 illustrates an example of a perspective view of a wiring. FIG. 12 illustrates a perspective view of the wiring 30 including four conductive thread-like members 33A, 33B, 33C, and 33D. In FIG. 12, the conductive thread-like members 33C and 33D are drawn by dashed lines in terms of discriminability of a plurality of conductive thread-like members.

The conductive thread-like member 33A is provided on the first surface S1 side of the base member 11 and meanders within a surface which is parallel to the first surface S1 of the base member 11 so as to form a plurality of fold-back parts 321A and 322A.

The conductive thread-like member 33B is provided on the second surface S2 side of the base member 11 and meanders within a surface which is parallel to the second surface S2 of the base member 11 so as to form a plurality of fold-back parts 321B and 322B.

The conductive thread-like member 33C meanders within the surface which is orthogonal to the first surface S1 and the second surface S2 of the base member 11 (within the X-Z surface) so as to form a plurality of fold-back parts 321C and 322C. The fold-back parts 321C of the conductive thread-like member 33C are entangled with respective corresponding fold-back parts 321A of the conductive thread-like member 33A, and the fold-back parts 322C of the conductive thread-like member 33C are entangled with respective corresponding fold-back parts 321B of the conductive thread-like member 33B.

The conductive thread-like member 33D meanders within the surface which is orthogonal to the first surface S1 and the second surface S2 of the base member 11 (within the X-Z surface) so as to form a plurality of fold-back parts 321D and 322D. The fold-back parts 321D of the conductive thread-like member 33D are entangled with respective corresponding fold-back parts 322A of the conductive thread-like member 33A, and the fold-back parts 322D of the conductive thread-like member 33D are entangled with respective corresponding fold-back parts 322B of the conductive thread-like member 33B.

The wiring 30 may have high stretchability not only in the X direction but also in the Y direction, by sewing the four conductive thread-like members 33A, 33B, 33C, and 33D into the base member 11 as described above.

Figure 13:
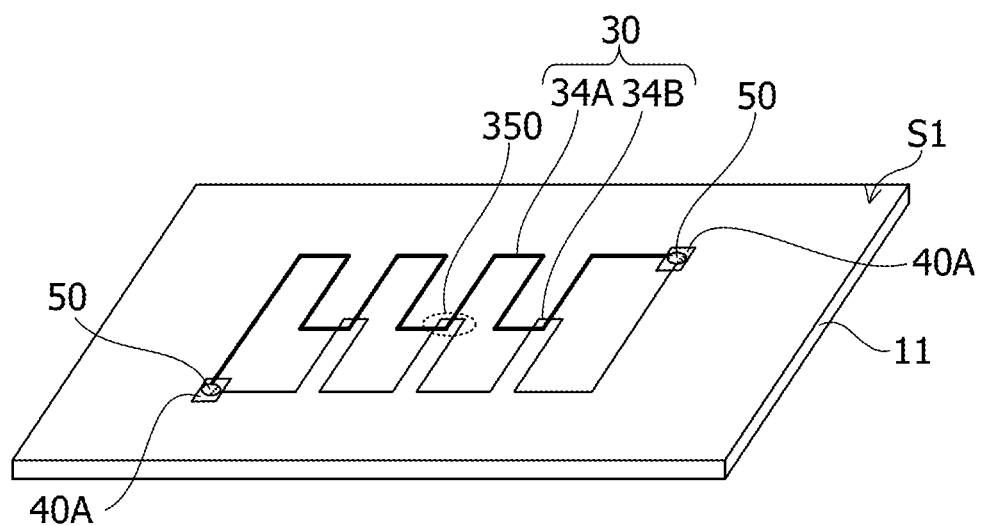
FIG. 13 illustrates an example of a perspective view of a wiring.

FIG. 13 illustrates an example of a perspective view of a wiring. In FIG. 13, conductive thread-like members 34A and 34B respectively meander within a surface which is parallel to the first surface S1 which is the main surface of the base member 11 (within the X-Y surface) so as to form a plurality of fold-back parts.

The conductive thread-like members 34A and 34B have interlaced parts 350, on which the conductive thread-like members 34A and 34B are entangled with each other, on the fold-back parts. For example, the conductive thread-like members 34A and 34B are electrically connected with each other on each of the interlaced parts 350 and a single wiring 30, which transmits a single signal, is composed of these two conductive thread-like members 34A and 34B.

The conductive thread-like members 34A and 34B are fixed on the first surface S1 of the base member 11 such that terminating end parts of each of the conductive thread-like members 34A and 34B are connected to wiring patterns 40A with the conductive bonding member 50, for example.

Though the wiring 30 is used as a signal wiring in the above description, the wiring 30 may be used as a power source wiring or a ground wiring. The form of sewing of a plurality of conductive thread-like members, which are included in the wiring 30, into the base member may be altered as appropriate.

The wiring board 10 may be an example of a wiring board. The base members 11, 11a, 11b, and 11c may be an example of a base member in the disclosed technique. The wiring 30 may be an example of a wiring in the disclosed technique. The conductive thread-like members 31A, 31B, 32A, 32B, 32C, 33A, 33B, 33C, 33D, 34A, and 34B may be an example of a conductive thread-like member. The interlaced parts 310, 330, 340, and 350 may be an example of an interlaced part. The wiring pattern 40A may be an example of a first wiring pattern. The wiring pattern 40B may be an example of a second wiring pattern. The wirings 20A and 20B may be an example of a wiring including a conductive member having stretchability.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A wiring board comprising: a base member having stretchability; and a wiring including a plurality of conductive thread-like members that are sewn in the base member in a meandering manner and do not have stretchability, wherein the wiring includes: a first conductive thread-like member that meanders within a surface orthogonal to a main surface of the base member so as to form a plurality of first fold-back parts; and a second conductive thread-like member that meanders within the surface orthogonal to the main surface of the base member so as to form a plurality of second fold-back parts which are entangled with the respective first fold-back parts on one side.

2. The wiring board according to claim 1, wherein the plurality of conductive thread-like members form a plurality of interlaced parts on which the plurality of conductive thread-like members are entangled with each other.

3. The wiring board according to claim 2, wherein the plurality of conductive thread-like members are electrically coupled with each other on the plurality of interlaced parts.

4. The wiring board according to claim 1, wherein a surface of each of the plurality of conductive thread-like members is covered by an insulator.

5. The wiring board according to claim 1, wherein a terminating end part of at least one of the plurality of conductive thread-like members is fixed on a first surface of the base member and a terminating end part of at least another of the plurality of conductive thread-like members is fixed on a second surface of the base member, the second surface being on a side opposite to the first surface.

6. The wiring board according to claim 3, wherein a first wiring pattern formed on the first surface of the base member and a second wiring pattern formed on the second surface of the base member are electrically coupled with each other via the plurality of conductive thread-like members, the second surface being on the side opposite to the first surface.

7. The wiring board according to claim 1, further comprising: a wiring provided on a surface of the base member and including a conductive member having stretchability.

8. The wiring board according to claim 1, wherein the wiring includes: a first conductive thread-like member that meanders within a surface orthogonal to a main surface of the base member so as to form a plurality of first fold-back parts; a second conductive thread-like member that meanders within the surface orthogonal to the main surface of the base member so as to form a plurality of second fold-back parts and which are entangled with the respective first fold-back parts of the first conductive thread-like member on one side of the plurality of second fold-back parts; and a third conductive thread-like member that meanders within the surface orthogonal to the main surface of the base member so as to form a plurality of third fold-back parts which are entangled with the respective second fold-back parts of the second conductive thread-like member on the other side of the plurality of second fold-back parts opposite to the one side.

9. The wiring board according to claim 1, wherein the wiring includes: a first conductive thread-like member that is provided on a side of a first surface of the base member and meanders within a surface parallel to the first surface of the base member so as to form a plurality of first fold-back parts; a second conductive thread-like member that is provided on a side of a second surface of the base member opposite to the first surface and meanders within a surface parallel to the second surface of the base member so as to form a plurality of second fold-back parts; a third conductive thread-like member that meanders within a surface orthogonal to the first surface and the second surface so as to form a plurality of third fold-back parts which are entangled with the respective first fold-back parts and the respective second fold-back parts on one side of the first fold-back parts and the second fold-back parts; and a fourth conductive thread-like member that meanders within the surface orthogonal to the first surface and the second surface so as to form a plurality of fourth fold-back parts which are entangled with the respective first fold-back parts and the respective second fold-back parts on the other side of the first fold-back parts and the second fold-back parts.

10. The wiring board according to claim 1, wherein the wiring includes: a first conductive thread-like member that meanders within a surface parallel to a main surface of the base member so as to form a plurality of first fold-back parts; and a second conductive thread-like member that meanders within the surface parallel to the main surface of the base member so as to form a plurality of second fold-back parts which are entangled with the respective first fold-back parts of the first conductive thread-like member on one side.

11. The wiring board according to claim 1, wherein the conductive thread-like member is a metal wire.

12. The wiring board according to claim 1, wherein the conductive thread-like member is a conductive yarn obtained by coating a surface of a yarn including an insulator with a conductor.

* * * * *